United States Patent [19]

Sasaki et al.

[11] Patent Number: 5,029,279
[45] Date of Patent: Jul. 2, 1991

[54] STANDARD CELLS WITH FLIP-FLOPS LOCATED IN A SINGLE REGION AND HAVING MINIMAL-LENGTH CLOCK LINES

[75] Inventors: Tohru Sasaki, Kawasaki; Takeji Tokumaru, Yokohama; Tsuneaki Kudo, Kawasaki, all of Japan

[73] Assignee: Kabushiki Kaisha Toshiba, Kawasaki, Japan

[21] Appl. No.: 379,791

[22] Filed: Jul. 17, 1989

[30] Foreign Application Priority Data

Jul. 19, 1988 [JP] Japan ................................ 63-178214

[51] Int. Cl.$^5$ .......................................... H03K 19/177
[52] U.S. Cl. .................................. 307/303.1; 307/465; 307/480; 364/491
[58] Field of Search ............ 307/465, 480, 269, 272.2, 307/303.1; 357/45; 364/488-491

[56] References Cited

U.S. PATENT DOCUMENTS

| 4,694,403 | 9/1987 | Nomura | 364/488 |
| 4,750,027 | 6/1988 | Asami | 357/45 |
| 4,851,717 | 7/1989 | Yabe | 357/45 X |
| 4,870,300 | 9/1989 | Nakaya et al. | 357/45 X |
| 4,883,980 | 11/1989 | Movimoto et al. | 307/465.1 |

OTHER PUBLICATIONS

Van Dyke, "Physical Partitioning of Logical Functions in VLSI Chip Design" *IBM T.D.B.*, vol. 27, No. 8, 1-1985, pp. 4648-4651.

*Primary Examiner*—David Hudspeth
*Attorney, Agent, or Firm*—Foley & Lardner

[57] ABSTRACT

Standard cells in which the accurate estimation of the clock routing length and the minimization of the clock routing are possible so that an optimal protection against the malfunctions due to the racing can be schemed. The standard cells includes flip-flop circuits collectively arranged in a region of the substrate; and clock routing for the flip-flop circuits with connections connecting the clock routing and each of the flip-flop circuits at shortest distance.

6 Claims, 5 Drawing Sheets

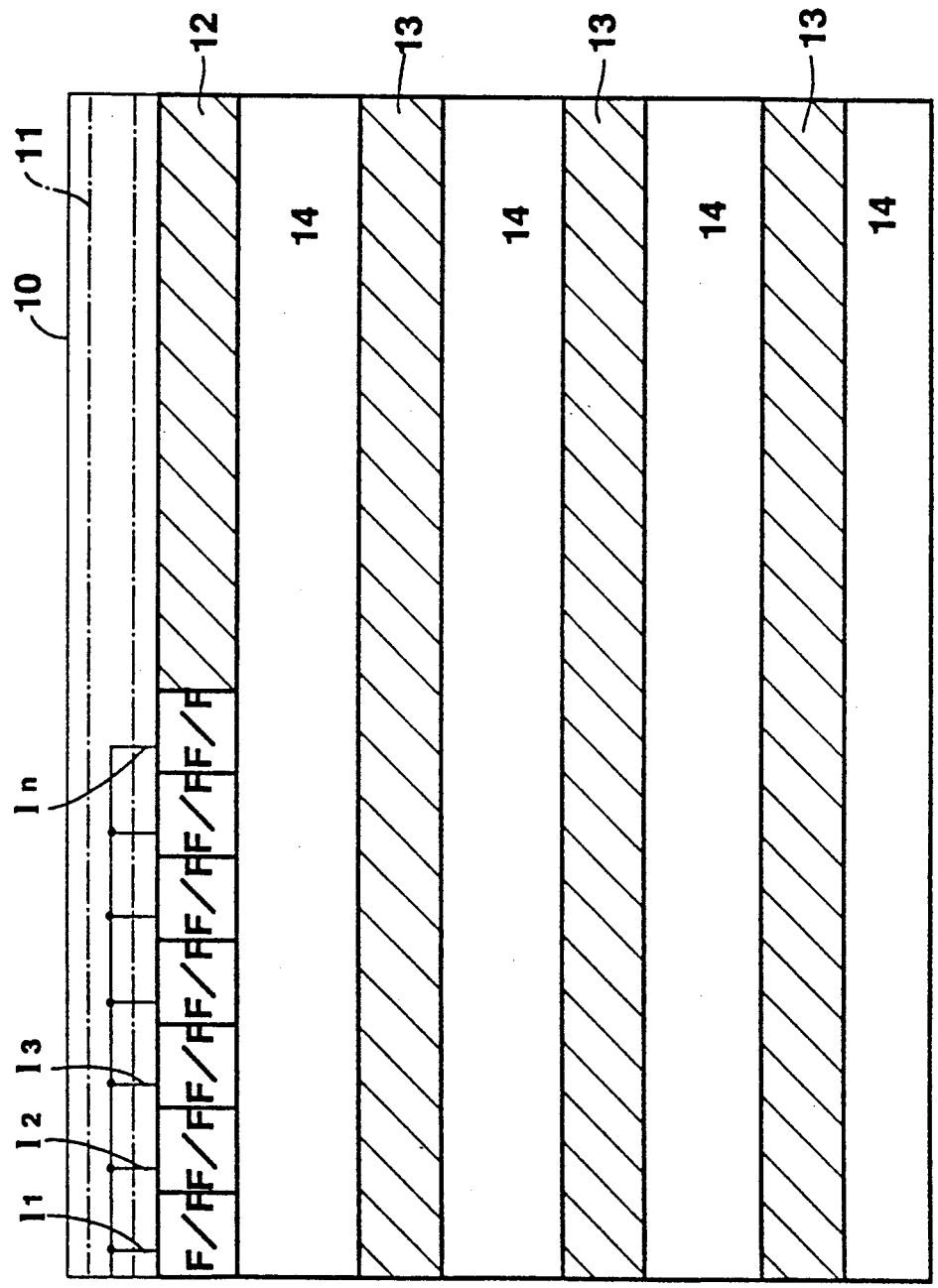

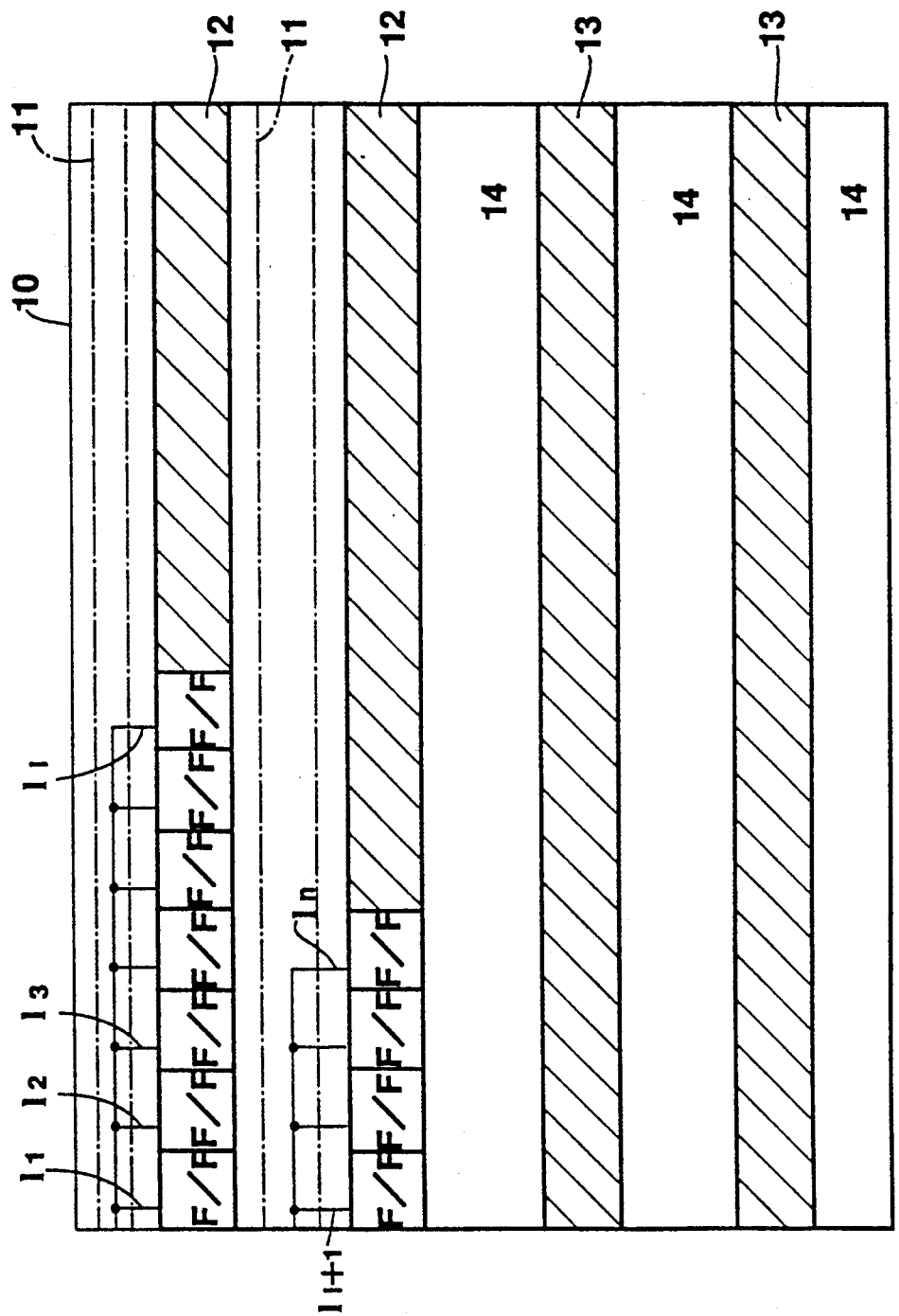

STANDARD CELLS WITH FLIP-FLOPS LOCATED IN A SINGLE REGION AND HAVING MINIMAL-LENGTH CLOCK LINES

BACKGROUND OF THE INVENTION

1. Field of the Invention

The present invention relates to standard cells which is a type of semi-custom LSI and more particularly, to such standard cells which include flip-flop circuits.

2. Description of the Background Art

In designing the placement and routing of certain types of logical circuits in standard cells, care must be taken to avoid possible malfunctions.

In particular when the standard cell involves flip-flops, considerations must be given to take care of malfunctions due to so-called clock-skew and racing.

First, clock-skew will be explained with references to FIGS. 1 and 2. In a shift register shown in FIG. 1. a clock signal CLK1 for a first flip-flop FF1 and a clock signal CLK2 for a second flip-flop FF2 have, as shown in FIG. 2, a phase difference called skew due to presence of routing resistance R and routing capacitance C in a clock routing CLK between the first and second flip-flops FF1 and FF2. The appearance of such a skew in clock signal is called clock-skew. Since the longer routing makes more delay of a transmission of a clock signal between two flip flops, it is desirable for the flip-flops to have the routing for the clock signal as short as possible.

Next, racing will be explained with further references to FIGS. 3, 4 and 5. Again, in the shift register of FIG. 1,. when there is a large clock-skew while there is only a short routing between an output terminal Q of the first flip-flop FF1 and an input terminal D of the second flip-flop FF2, the switching of data at the input terminal D of the second flip-flop FF2 will occur before a switching of the clock at a point h, because a delay of data in going from the first flip-flop FF1 to the second flip-flop FF2 will be smaller than a delay of clock signal due to the clock-skew As a result as shown in FIG. 3, while a clock at a point g switches when data in a routing d is $a_1$ so that the first flip-flop FF1 receives data $a_1$, a corresponding clock at a point h switches so much later that data in a routing e has already switched from $a_0$ to $a_1$ by the time a clock at a point h switches so that the second flip-flop FF2 also receives the same data $a_1$ at the same timing, causing an erroneously premature output of data $a_1$ in a routing f. This phenomenon is called racing.

Conventionally, racing is avoided by providing an extra delay X between the output terminal Q of the first flip-flop FF1 and the input terminal D of the second flip-flop FF2 as shown in FIG. 4, such that a delay of data is suitably elongated to be compatible with a delay of clock due to the clock-skew so as to achieve a correct timing relationship shown in FIG. 5 in which the output in the routing f is correctly $a_0$.

Although this type of prevention of the racing by means of an extra delay between two flip-flops is very common, there is a tendency to use a delay with unnecessarily long delay time for such an extra delay, as a safety measure for the general situation where the length of the clock routing which determines an amount of clock-skew is not known precisely before the cell placing and routing. Furthermore, when another logical circuit, such as a combinational circuit, is to be connected between two flip-flops in addition to the delay, an actual operation time will be limited not only by the time for clock skew and the delay time of the delay but also by an access time of the combinational circuit, so that a severe limitation is posed on how much can be done in a single clock cycle. In such a case, the unnecessary delay time taken by the delay can be a serious obstacle to the improvement.

Thus, it is desirable on one hand to be able to estimate the length of the clock routing accurately so that the delay with just an appropriate delay time can be selected, and on the other hand to make the clock routing as short as possible so that the clock skew can be minimized.

However, as shown in FIG. 6, a conventional standard cell has flip-flops F/F scattered in numbers of lines R as a result of designing, so that the clock routings $1_1$, $1_2$, $1_3$, $1_4$, and $1_5$ becomes long and complicated, and neither an accurate estimation of the clock routing length nor minimization of the clock routing has been possible.

SUMMARY OF THE INVENTION

It is therefore an object of the present invention to provide standard cells in which the accurate estimation of the clock routing length and the minimization of the clock routing are possible so that an optimal protection against the malfunctions due to the racing can be achieved.

According to one aspect of the present invention there are provided standard cells, each comprising: a substrate on which circuits are to be arranged; flip-flop circuits collectively arranged in a region of the substrate, clock routing for the flip-flop circuits with connections connecting the clock routing and each of the flip-flop circuits at shortest distance: and other circuits arranged in a remaining region of the substrate.

Other features and advantages of the present invention will become apparent from the following description taken in conjunction with the accompanying drawings.

BRIEF DESCRIPTION OF THE DRAWINGS

FIG. 7 is a schematic circuit diagram of one embodiment of standard cells according to the present invention.

FIG. 8 is a schematic circuit diagram of another embodiment of standard cells according to the present invention.

DETAILED DESCRIPTION OF THE PREFERRED EMBODIMENTS

Figure 1:
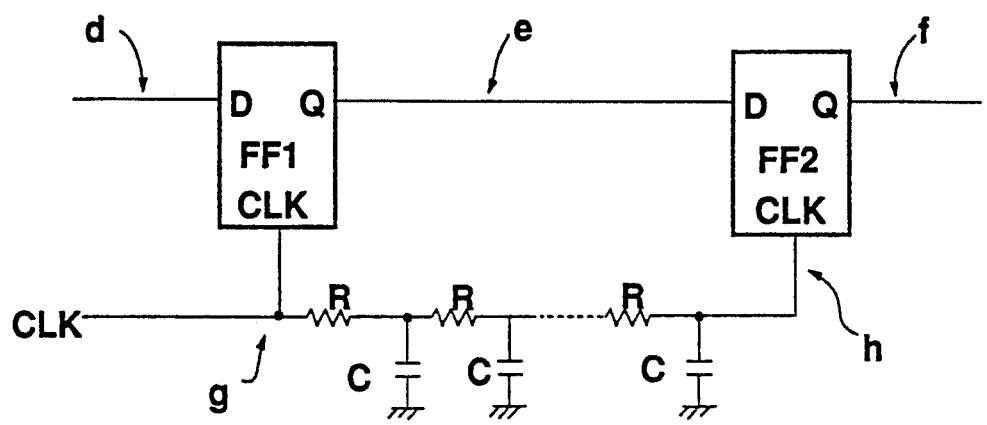
FIG. 1 is a circuit diagram of a conventional shift register for explaining the phenomena of clock-skew and racing.
Figure 2:
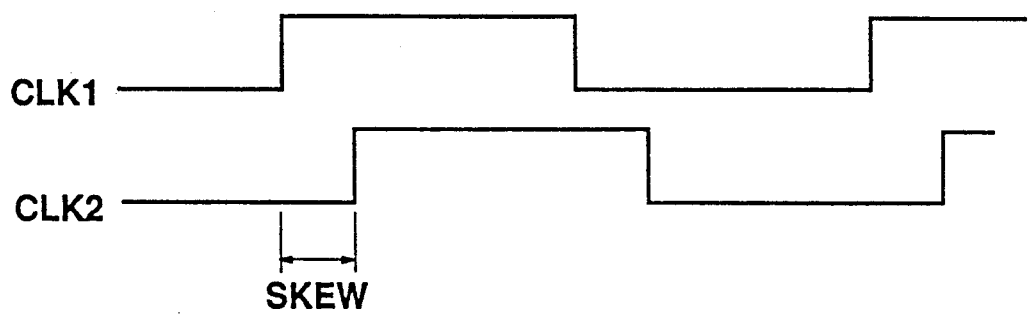
FIG. 2 is a timing chart for clock signals in the conventional shift register of FIG. 1 for explaining the phenomenon of clock-skew.
Figure 3:
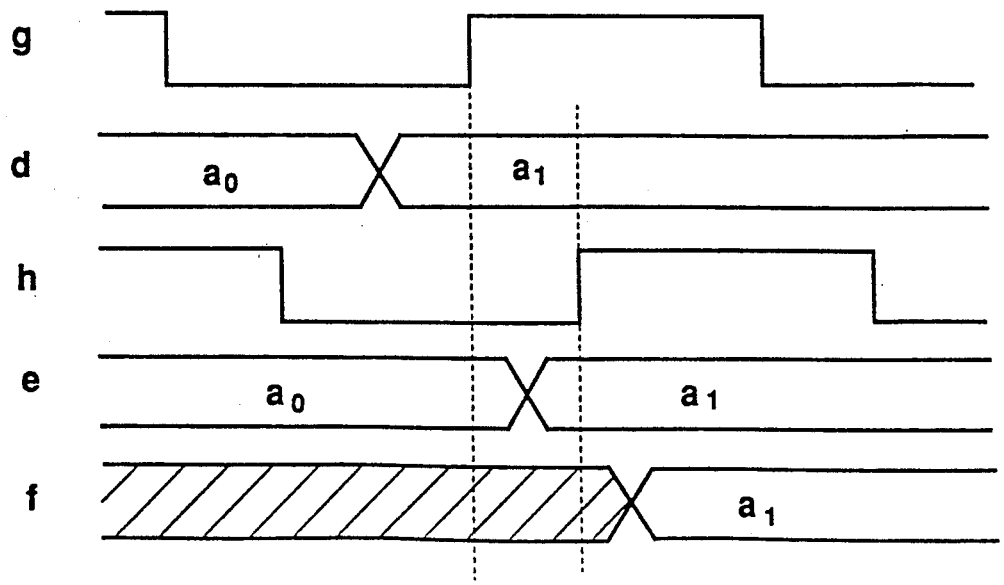
FIG 3 is a timing chart for clock signals and data signals for the flip-flops of the conventional shift register of FIG. 1 for explaining the phenomenon of racing.
Figure 4:
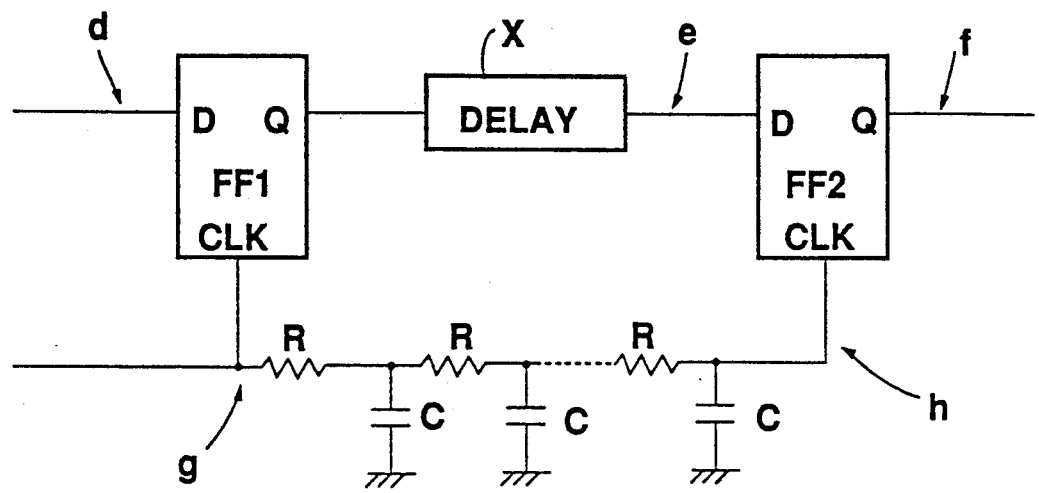
FIG. 4 is a circuit diagram of a conventional shift register with protection against the racing.
Figure 5:
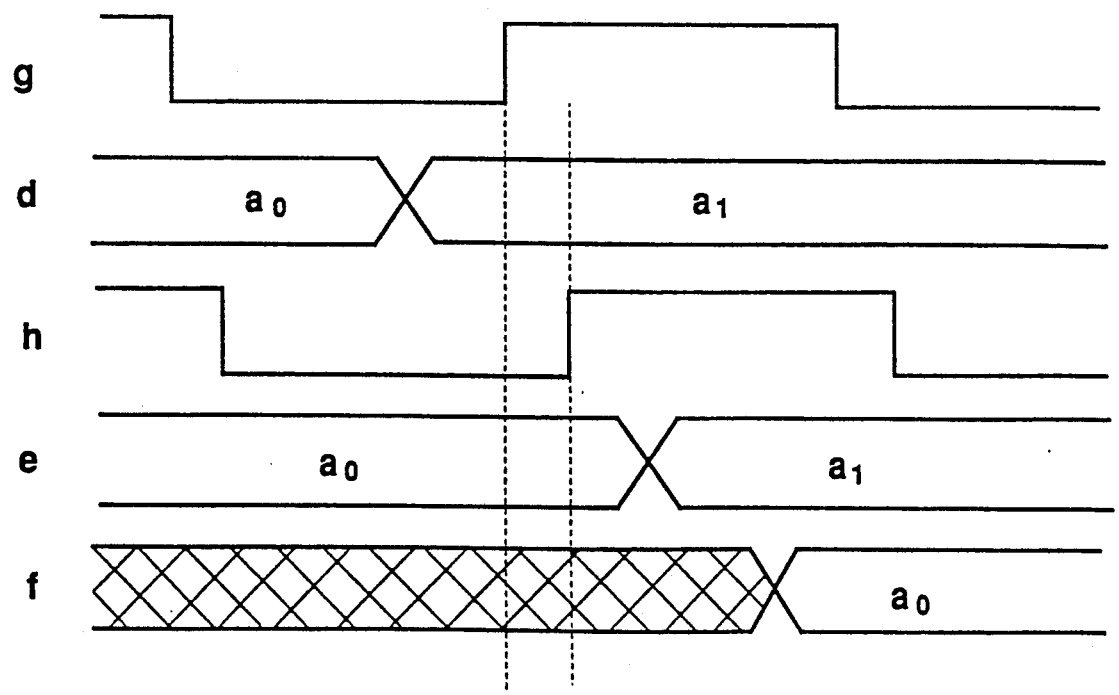
FIG. 5 is a timing chart for clock signals and data signals for the flip-flops of the conventional shift register with protection against the racing of FIG. 4 for explaining the effect of its protection.
Figure 6:
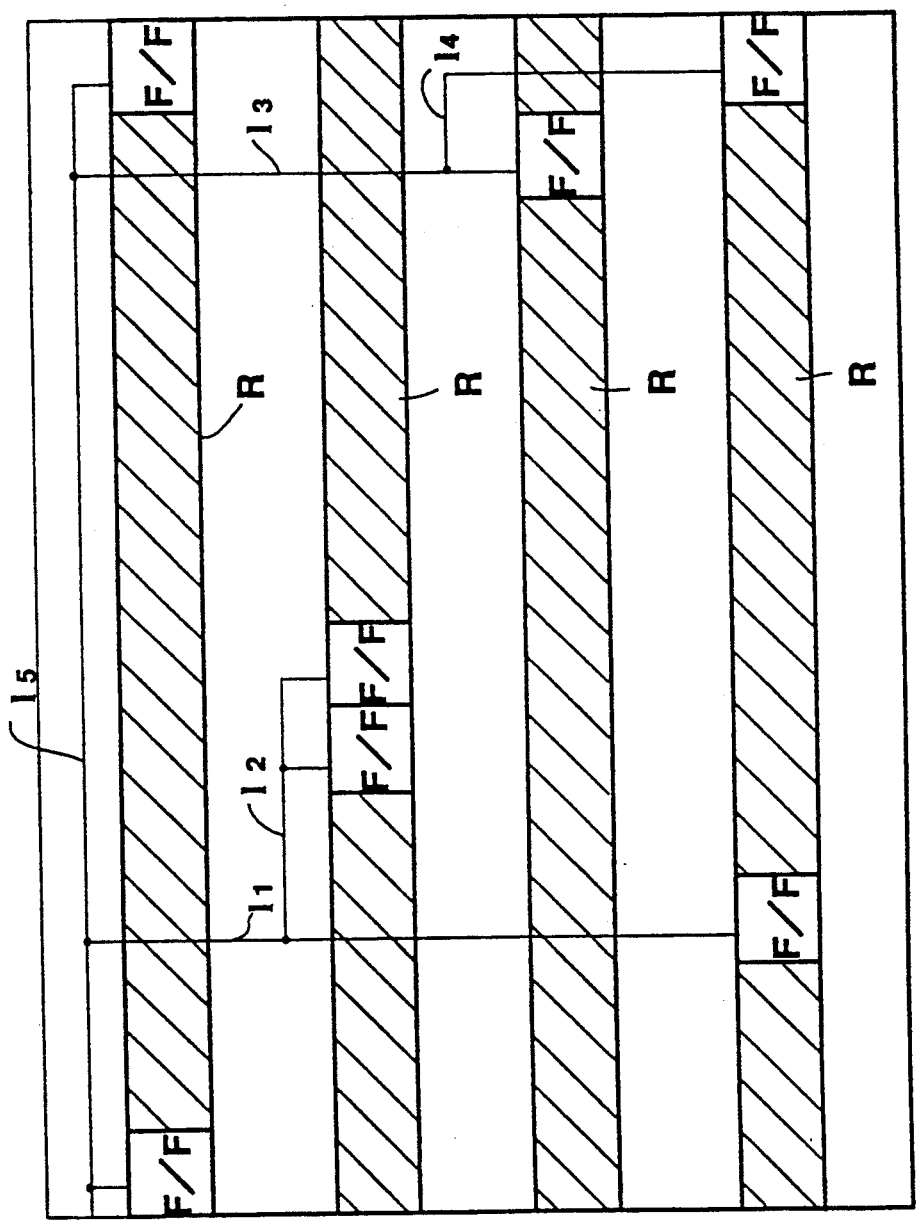
FIG. 6 is an example of a schematic circuit diagram of a conventional standard cells for explaining its problems.

Referring now to FIG. 7, there is shown one embodiment of standard cells according to the present invention.

In this embodiment standard cells is formed on an LSI substrate 10 by arranging numbers of flip-flops F/F collectively, one adjacent to another all on a single cell line comprising a flip-flop area 12 which has an associated clock routing area 11 located nearby along the flip-flop area 12, while other logical circuits are arranged in the remaining logical circuit areas 13 with other routing areas 14.

As shown in FIG. 7, numbers of connections $1_1, 1_2, -, 1_n$ are provided to connect each of the flip-flops F/F with the clock routing area 11 in shortest distances. Thus the clock routing in this embodiment is minimized so that the amount of clock-skew is minimized.

Moreover, in this embodiment, the clock routings are arranged in very ordered and simple geometrical manner and in particular, all the connections $1_1, 1_2, -, 1_n$ have the same length. All of these features significantly contribute to the fact that in this embodiment the clock routing length can accurately be estimated. Thus, from the resistance and capacitance of the clock routing and the estimated clock routing length, it is possible to select an appropriate delay to be incorporated for an optimal protection against the racing.

Referring now to FIG. 8, there is shown another embodiment of standard cells according to the present invention.

In this embodiment the previous embodiment is modified such that the flip-flops F/F are arranged not on a single cell line but on two cell lines. However, the same care to arrange the flip-flops F/F collectively in one specific region of the LSI substrate 10 has also been taken. The connections $1_1, 1_2, -, 1_i$ for an upper cell line for the flip-flops F/F and the connections $1_{i+1}, -, 1_n$ for a lower cell line for the flip-flops separately have the same advantageous features of the connections $1_1, 1_2, -, 1_n$ of the previous embodiment. Clearly the similar effects and advantages of the previous embodiment can be achieved by this embodiment.

It is obvious that further modification of the last embodiment in similar manner in which more cell lines for the flip-flops are used with the care to arrange the flip-flops F/F collectively in one specific region of the LSI substrate 10 is equally possible.

It is further to be noted that in the above embodiments, the clock routing may be incorporated within the flip-flop area 12, without providing a separate clock routing area 11.

Besides these many modifications and variations of the above embodiments may be made without departing from the novel and advantageous features of the present invention. Accordingly, all such modifications and variations are intended to be included within the scope of the appended claims.

What is claimed is:

1. An array of standard cells, comprising:
   a substrate on which circuits are arranged;
   a plurality of flip-flop circuits, all of which are collectively arranged in a single continuous region of the substrate occupying less than entire rows located adjacent each other;
   a clock positioned in other than said less than entire rows and providing clock routing for said flip-flop circuits, with connections as short as possible connecting the clock routing and each of the flip-flop circuits; and
   other circuits arranged in the remaining region of the substrate.

2. The standard cells of claim 1, wherein the region for the flip-flop circuits comprises a single cell line.

3. The standard cells of claim 2, wherein the flip-flop circuits are arranged adjacent to each other on the cell line for the flip-flop circuits.

4. The standard cells of claim 2, wherein the clock routing is provided along the cell line for the flip-flop circuits.

5. The standard cells of claim 4, wherein all of the connections between the clock routing and the flip-flop circuits have the same lengths.

6. The standard cells of claim 2, wherein the clock routing is included within the region for the flip-flop circuits.

* * * * *